United States Patent
Nishibayashi et al.

(10) Patent No.: US 10,697,088 B2
(45) Date of Patent: Jun. 30, 2020

(54) SINGLE-CRYSTAL DIAMOND MATERIAL, AND TOOL, RADIATION TEMPERATURE MONITOR, AND INFRARED OPTICAL COMPONENT INCLUDING SAID DIAMOND MATERIAL

(71) Applicants: Sumitomo Electric Industries, Ltd., Osaka-shi (JP); SUMITOMO ELECTRIC HARDMETAL CORP., Itami-shi (JP)

(72) Inventors: Yoshiki Nishibayashi, Itami (JP); Akihiko Ueda, Itami (JP); Yutaka Kobayashi, Itami (JP)

(73) Assignees: Sumitomo Electric Industries, Ltd., Osaka-shi (JP); Sumitomo Electric Hardmetal Corp., Itami-shi (JP)

( * ) Notice: Subject to any disclaimer, the term of this patent is extended or adjusted under 35 U.S.C. 154(b) by 88 days.

(21) Appl. No.: 15/523,066

(22) PCT Filed: Oct. 29, 2015

(86) PCT No.: PCT/JP2015/080571
§ 371 (c)(1),
(2) Date: Apr. 28, 2017

(87) PCT Pub. No.: WO2016/068244
PCT Pub. Date: May 6, 2016

(65) Prior Publication Data
US 2017/0314159 A1   Nov. 2, 2017

(30) Foreign Application Priority Data

Oct. 29, 2014 (JP) .................... 2014-220028

(51) Int. Cl.
| | | |
|---|---|---|
| C30B 29/04 | (2006.01) | |
| C23C 16/27 | (2006.01) | |
| C30B 25/20 | (2006.01) | |
| C01B 32/26 | (2017.01) | |
| C30B 25/02 | (2006.01) | |
| G01K 11/18 | (2006.01) | |
| G02B 5/20 | (2006.01) | |

(52) U.S. Cl.
CPC ............. *C30B 29/04* (2013.01); *C01B 32/26* (2017.08); *C23C 16/27* (2013.01); *C30B 25/02* (2013.01); *C30B 25/205* (2013.01); *G01K 11/18* (2013.01); *G02B 5/208* (2013.01); *C01P 2006/40* (2013.01); *C01P 2006/60* (2013.01); *C01P 2006/80* (2013.01)

(58) Field of Classification Search
None
See application file for complete search history.

(56) References Cited

U.S. PATENT DOCUMENTS

| | | | |
|---|---|---|---|
| 2010/0326135 A1* | 12/2010 | Twitchen | ............... C23C 16/27 63/26 |
| 2015/0176155 A1 | 6/2015 | Ueda et al. | |
| 2015/0176156 A1* | 6/2015 | Nishibayashi | .......... C30B 29/04 423/446 |

FOREIGN PATENT DOCUMENTS

| | | |
|---|---|---|
| EP | 3170926 A1 | 5/2017 |
| JP | 2005-512929 A | 5/2005 |
| WO | 03/052177 A1 | 6/2003 |
| WO | 2006/136929 A2 | 12/2006 |
| WO | 2014/003110 A1 | 1/2014 |

OTHER PUBLICATIONS

Tsuno et al., "Characterization of thick homoepitaxial film on diamond (001) substrate II," Proceedings of 9th Diamond Symposium, 1995, p. 61, Japan New Diamond Forum [Cited in Spec].
Linares et al., "Properties of large single crystal diamond," Diamond and Related Materials 8 (1999) p. 909-915.

* cited by examiner

*Primary Examiner* — Guinever S Gregorio
(74) *Attorney, Agent, or Firm* — Baker Botts L.L.P.; Michael A. Sartori

(57) ABSTRACT

A single-crystal diamond material has a transmittance of light with a wavelength of greater than or equal to 410 nm and less than or equal to 750 nm of less than or equal to 15% for any wavelength, and is at least either of an electrical insulator according to optical evaluation and an electrical insulator according to electrical evaluation. A criterion of the optical evaluation can be a transmittance of light with a wavelength of 10.6 μm of greater than or equal to 1%. A criterion of the electrical evaluation can be an average resistivity of greater than or equal to $1 \times 10^6$ Ωcm. Accordingly, a single-crystal diamond material having a low transmittance of light in the entire region of the visible light region and exhibiting a black color is provided.

10 Claims, No Drawings

US 10,697,088 B2

SINGLE-CRYSTAL DIAMOND MATERIAL, AND TOOL, RADIATION TEMPERATURE MONITOR, AND INFRARED OPTICAL COMPONENT INCLUDING SAID DIAMOND MATERIAL

TECHNICAL FIELD

The present invention relates to a single-crystal diamond material suitably used as a black body applied material, a heat radiation temperature monitoring material, a window material, an infrared optical component material, a heat radiation substrate (heat sink) or a tip for a tool, and a tool, a radiation temperature monitor, and an infrared optical component including the single-crystal diamond material.

BACKGROUND ART

Conventionally, materials that block the light in the visible region and transmit the light in the infrared region find various applications. Although various materials such as color glass are conceivable, few candidates that have durability at relatively high temperatures (for example, greater than or equal to about 700° C. and less than or equal to about 1200° C. in vacuo or in an inert gas) and can bear high quantity of heat (or can bear rapid temperature change) are known. As a material capable of bearing light of high strength and sufficiently radiating heat, diamond materials are recited.

However, those having light transmissivity in the visible region as with the diamond materials are common, and they do not completely block the light in the visible region. If there is a material that blocks the light in the visible region and transmits the light in the infrared region, it can be used as a reference for temperature measurement of a heated object in vacuo as a visible region temperature monitoring chip of ideal black body radiation. If the material is insulative, it can be used also on an energized heating unit. Such a material can also be used as a window through which the interior of a dark room can be monitored with the infrared light. This means application to a window intended for observation of a nocturnal animal. This also allows measurement of the temperature in monitoring the temperature of the edge of a tool.

Diamond has a band gap of as large as 5.5 eV, and is generally believed to be transparent. However, diamond can be made to have absorption at a specific wavelength by means of impurities. As disclosed, for example, in Takashi TSUNO, Nobuhiro OTA, and Yoshiaki KUMAZAWA, Proceedings of 9th Diamond Symposium, p. 61 (NPD 1), Robert Linares, Patrick Doering, Diamond and Related Materials 8 (1999) p. 909 (NPD 2) and National Patent Publication No. 2005-512929 (PTD 1), it is known that light absorption occurs in the ultraviolet region around a wavelength of 270 nm when the diamond is doped with nitrogen in a substituted form as an impurity. Moreover, as disclosed in National Patent Publication No. 2005-512929 (PTD 1), it is known that absorption occurs in the wavelength region of around 500 nm to 640 nm due to association of nitrogen added to the diamond as an impurity with a vacancy defect. It is known that such absorption makes the diamond transparent yellow or transparent red.

CITATION LIST

Patent Document

PTD 1: National Patent Publication No. 2005-512929

Non Patent Document

NPD 1: Takashi TSUNO, Nobuhiro OTA, and Yoshiaki KUMAZAWA, Proceedings of 9th Diamond Symposium, p. 61
NPD 2: Robert Linares, Patrick Doering, Diamond and Related Materials 8 (1999) p. 909

SUMMARY OF INVENTION

Technical Problems

In the above case, since only the light with a specific wavelength is absorbed, it is difficult to block the light in the entire region of the visible light region (for example, 410 nm to 750 nm). Moreover, it is necessary to mix a large quantity of impurities even for blocking the light with the specific wavelength. Since introduction of a large quantity of impurities into the diamond leads breakage of the diamond crystal structure, the crystal can no longer be kept as diamond.

On the other hand, as a technique for absorbing the light in the entire region of the visible light region, the following methods are conceivable. One method is addition of boron as an impurity. It is known that trace amount of added boron is doped substitutionally with carbon, and makes the diamond blue. Since boron has an atomic radius similar to that of carbon and is easily incorporated into diamond, when a large quantity of boron is incorporated into diamond, the light in the visible light region is absorbed and blocked, and the diamond that has absorbed light turns black. However, in such a condition, a current starts to flow. The resultant low resistance not only causes blockage of the light in the entire region of the visible light region, but also causes absorption and blockage of the light in the infrared region.

Another method is to incorporate a graphite component (SP2 component) into diamond by forming polycrystalline, low-quality diamond. This makes it possible to absorb and block the light in the visible light region. Since a large quantity of graphite component is contained in diamond, the electric resistance increases for the direct current whereas the electric resistance decreases for the alternate current, and the light in the infrared region is also absorbed and blocked. The method of absorbing and blocking the light in the visible light region by ion implantation also leads to a similar result because a layer of a graphite component (SP2 component) is formed in the ion implantation layer.

In light of the above, it is an object of the present invention to solve the aforementioned problems, and to provide diamond having low transmittance of light in the entire region of the visible region, and exhibiting a black color, and a tool, a radiation temperature monitor, and an infrared optical component including such a single-crystal diamond material.

Solutions to Problems

A single-crystal diamond material according to one aspect of the present invention has a transmittance of light with a wavelength of greater than or equal to 410 nm and less than or equal to 750 nm of less than or equal to 15% for any wavelength, and is at least either of an electrical insulator according to optical evaluation and an electrical insulator according to electrical evaluation. A tool according to another aspect of the present invention includes the single-crystal diamond material according to the above aspect. A radiation temperature monitor according to still another aspect of the present invention includes the single-crystal diamond material according to the above aspect. An infrared optical component according to yet still another aspect of the present invention includes the single-crystal diamond material according to the above aspect.

Advantageous Effects of Invention

According to the above, it is possible to provide diamond having low transmittance of light in the entire region of the visible region, and exhibiting a black color, and a tool, a radiation temperature monitor, and an infrared optical component including such a single-crystal diamond material.

DESCRIPTION OF EMBODIMENTS

Description of Embodiments of the Present Invention

A single-crystal diamond material according to one embodiment of the present invention has a transmittance of light with a wavelength of greater than or equal to 410 nm and less than or equal to 750 nm of less than or equal to 15% for any wavelength, and is at least either of an electrical insulator according to optical evaluation and an electrical insulator according to electrical evaluation. In the single-crystal diamond material of the present embodiment, the transmittance of light refers to the transmittance of light that enters substantially perpendicularly (the angle of deviation from the perpendicular direction is less than or equal to 0.1°) to one principal surface and radiates from the other principal surface irrespectively of the wavelength of the light, when two planes that are substantially flat (the arithmetic mean roughness Ra of surface defined by JIS B0601:2013 is less than or equal to 2 nm) and parallel (the degree of parallelism is less than or equal to 0.1°) randomly specified in the single-crystal diamond material are defined as principal surfaces, in other words, the transmittance of light refers to the transmittance of light that enters at an angle of deviation from the direction perpendicular to one principal surface of less than or equal to 0.1° and radiates from the other principal surface when these principal surfaces having a degree of parallelism of less than or equal to 0.1° are formed by processing. The electrical insulator according to optical evaluation refers to an electrical insulator (an object that does not substantially conduct electricity) that is evaluated optically, and the electrical insulator according to optical evaluation preferably refers to an object having a transmittance of light with a wavelength of 10.6 μm of greater than or equal to 1%. The electrical insulator according to electrical evaluation refers to an electrical insulator (an object that does not substantially conduct electricity) that is evaluated electrically, and the electrical insulator according to electrical evaluation preferably refers to an object having an average resistivity of greater than or equal to $1 \times 10^6$ Ωcm. In other words, it means that the single-crystal diamond material of the present embodiment is entirely an electrical insulator, and does not have a conductive layer in part of the surface or the inside as long as it is used substantially for the use purpose. Since the single-crystal diamond material of the present embodiment has a transmittance of light with a wavelength of greater than or equal to 410 nm and less than or equal to 750 nm of less than or equal to 15% for any wavelength, and is an insulator optically or electrically, it has a deep black color tone and insulation properties.

In the single-crystal diamond material of the present embodiment, a criterion of the optical evaluation can be a transmittance of light with a wavelength of 10.6 μm of greater than or equal to 1%. Since such a single-crystal diamond material has a transmittance of light with a wavelength of 10.6 μm of greater than or equal to 1%, it has a deep black color tone and transmissivity for infrared light, namely optical insulation properties.

In the single-crystal diamond material of the present embodiment, a criterion of the electrical evaluation can be an average resistivity of greater than or equal to $1 \times 10^6$ Ωcm. The average resistivity of the single-crystal diamond material of the present embodiment refers to the average resistivity that is calculated from the voltage, the current, the area of the titanium vapor-deposited electrode, and the distance between the principal surfaces when the current is caused to flow at 25° C. under a voltage of 50 V by using the titanium vapor-deposited electrode. Such a single-crystal diamond material has a deep black color tone and electrical insulation properties.

In the single-crystal diamond material of the present embodiment, the transmittance of light with a wavelength of greater than or equal to 410 nm and less than or equal to 750 nm can be less than or equal to 3% for any wavelength. As a result, such single-crystal diamond material has a jet-black color tone and insulation properties.

In the single-crystal diamond material of the present embodiment, the total nitrogen concentration can be greater than or equal to eight times the isolated substitutional nitrogen concentration. The total nitrogen concentration is measured by secondary ion mass spectrometry (SIMS), and the isolated substitutional nitrogen concentration is measured by an electron spin resonance (ESR) analysis. As a result, such single-crystal diamond material has a deep black color tone and insulation properties.

In the single-crystal diamond material of the present embodiment, the total nitrogen concentration can be greater than or equal to 1 ppm. As a result, such single-crystal diamond material has a deep black color tone and insulation properties.

In the single-crystal diamond material of the present embodiment, the non-substitutional nitrogen concentration calculated by subtracting the isolated substitutional nitrogen concentration from the total nitrogen concentration can be greater than or equal to 0.875 ppm. Herein, the non-substitutional nitrogen concentration is a value obtained by subtracting the isolated substitutional nitrogen concentration measured by the ESR from the total nitrogen concentration measured by the SIMS. In addition, the vacancy concentration can be made higher than 0.1 times the non-substitutional nitrogen concentration. As a result, such single-crystal diamond material is capable of containing a large quantity of nitrogen atoms without causing breakage or chipping of the crystals, and has a deep black color tone and insulation properties.

In the single-crystal diamond material of the present embodiment, the vacancy concentration can be made higher than at least any of the isolated substitutional nitrogen concentration, the non-substitutional nitrogen concentration, the total nitrogen concentration and 1 ppm. The vacancy concentration is determined by positron annihilation based on the quantification and measurement by the ion implantation technique. Alternatively, the concentration of vacancies bound with impurities measured by the ESR is used subsidiarily. As a result, such single-crystal diamond material is capable of containing a large quantity of nitrogen atoms without causing breakage or chipping of the crystals, and has a deep black color tone and insulation properties.

In the single-crystal diamond material of the present embodiment, the total impurity element concentration of at least one impurity element selected from the group consisting of magnesium, aluminum, silicon, phosphorus and sulfur can be greater than or equal to 50 ppb. The total impurity element concentration is measured by the SIMS. As a result, such single-crystal diamond material is capable of containing a large quantity of nitrogen, and has a deep black color tone and insulation properties.

In the single-crystal diamond material of the present embodiment, the total impurity element concentration of at least one impurity element selected from the group consisting of magnesium, aluminum, silicon, phosphorus and sulfur can be greater than or equal to eight times the total substitutional impurity element concentration of the impurity element. The total impurity element concentration is measured by the SIMS, and the total substitutional impurity element concentration is measured by the ESR. As a result, such a single-crystal diamond material has a deep black color tone and insulation properties.

In the single-crystal diamond material of the present embodiment, the total boron concentration can be less than or equal to the total nitrogen concentration. The total boron concentration and the total nitrogen concentration are measured by the SIMS. Such single-crystal diamond material is capable of containing a large quantity of nitrogen without being imparted with the conductivity, and has a deep black color tone and insulation properties.

A tool according to another embodiment of the present invention includes the single-crystal diamond material of the foregoing embodiment. Therefore, the tool of the present embodiment can be a tool that is less likely to be chipped during manufacture and use of the tool.

A radiation temperature monitor according to still another embodiment of the present invention includes the single-crystal diamond material of the foregoing embodiment. Therefore, the radiation temperature monitor of the present embodiment is more approximate to black body radiation, and a real temperature can be evaluated.

An infrared optical component according to yet still another embodiment of the present invention includes the single-crystal diamond material of the foregoing embodiment. Therefore, the infrared optical component of the present embodiment is accompanied by very little leakage of visible light, and is capable of sensing the infrared light sufficiently.

Details of the Embodiments of the Present Invention

In the single-crystal diamond material of the present embodiment, the transmittance of light with a wavelength of greater than or equal to 410 nm and less than or equal to 750 nm is less than or equal to 15%, preferably less than or equal to 10%, more preferably less than or equal to 8% for any wavelength. Moreover, the single-crystal diamond material of the present embodiment is at least either of an electrical insulator according to optical evaluation and an electrical insulator according to electrical evaluation. In the single-crystal diamond material of the present embodiment, since the transmittance of light with a wavelength of greater than or equal to 410 nm and less than or equal to 750 nm is less than or equal to 15% for any wavelength, and the single-crystal diamond material is an electrical insulator according to at least either of the optical evaluation and the electrical evaluation, the single-crystal diamond material has a deep black color tone and insulation properties.

The transmittance of light of the single-crystal diamond material of the present embodiment is defined in the following manner by specifying the path of the light because the path of the light is important. The transmittance of light of the single-crystal diamond material refers to the transmittance of light that enters substantially perpendicularly (the angle of deviation from the perpendicular direction is less than or equal to 0.1°) to one principal surface and radiates from the other principal surface irrespectively of the wavelength of the light, when two planes that are substantially flat (the arithmetic mean roughness Ra of surface defined by JIS B0601:2013 is less than or equal to 2 nm) and parallel (the degree of parallelism is less than or equal to 0.1°) randomly specified in the single-crystal diamond material are defined as principal surfaces, in other words, the transmittance of light refers to the transmittance of light that enters at an angle of deviation from the direction perpendicular to one principal surface of less than or equal to 0.1° and radiates from the other principal surface when these principal surfaces having an arithmetic mean roughness Ra of surface of less than or equal to 2 nm and a degree of parallelism of less than or equal to 0.1° are formed by processing. The electrical insulator according to optical evaluation refers to an electrical insulator (an object that does not substantially conduct electricity) that is evaluated optically, and is an object for which the transmittance of light with the wavelength in the infrared region of 10.6 μm can be proved not to be zero, and preferably having a transmittance of light with a wavelength of 10.6 μm of greater than or equal to 1%. The electrical insulator according to electrical evaluation refers to an electrical insulator (an object that does not substantially conduct electricity) that is evaluated electrically, and is an object for which the average resistivity can be proved not to be zero, and preferably having an average resistivity of greater than or equal to $1\times10^6$ Ωcm. The average resistivity of the single-crystal diamond material of the present embodiment refers to the average resistivity that is calculated from the voltage, the current, the area of the titanium vapor-deposited electrode, and the distance between the principal surfaces when the current is caused to flow at 25° C. under a voltage of 50 V by using the titanium vapor-deposited electrode.

Since the single-crystal diamond material of the present embodiment has a low transmittance of light in the visible region of greater than or equal to 410 nm and less than or equal to 750 nm, and is an insulator at least either optically or electrically, ideal black body radiation can be realized in monitoring the temperature, and the object to be heated can be brought into an insulated state. The resultant material is not a merely black body like soot, and is not metallic, but is capable of having a texture with depth and three-dimensional effect. The black body of the single-crystal diamond material of the present embodiment does not result from SP2 bonds of carbon, but is pure diamond formed by SP3 bonds of carbon which is no longer easy to be cracked or chipped under high temperatures.

When the transmittance of light with a wavelength of 530 nm for which human luminosity factor is high is less than or equal to 20%, diamond having a black color tone (hereinafter, also referred to as black diamond) is achieved, however, it is insufficient in terms of blocking the light. When the transmittance of light in the entire region of the visible light region (wavelength of greater than or equal to 410 nm and less than or equal to 750 nm) is less than or equal to 15%, preferably less than or equal to 10%, more preferably less than or equal to 8%, diamond having a deep black color tone (hereinafter, also referred to as deep black diamond) is obtained. Since the reflectivity of diamond is typically about 30%, when the transmittance of light is less than or equal to ½, preferably less than or equal to ⅓, more preferably less than or equal to about ¼ of the reflectivity, a deep black color tone is obtained, and blockage by absorption of light is sufficient.

According to the aforementioned definition of the transmittance of light of the single-crystal diamond material, for the material in the form of a flat plate in which both of the principal surfaces are flat (the arithmetic mean roughness Ra of surface is less than or equal to 2 nm) and parallel (the degree of parallelism is less than or equal to 0.1°), the light can be entered substantially perpendicularly to one principal surface (the angle of deviation from the perpendicular direction is less than or equal to 0.1°). For the material in the form other than a flat plate, or in which there are no surfaces that are opposed to each other and flat (the arithmetic mean roughness Ra of surface is less than or equal to 2 nm) and parallel (the degree of parallelism is less than or equal to) 0.1°, opposed flat and parallel surfaces as described above may be made in the estimated nearest position, and the light may be entered substantially perpendicularly to one of the flat and parallel surfaces. This is because if the estimated nearest position falls within the range defined in the present invention, most of other positions fall within the range defined in the present invention. To be precise, the shape is measured by a laser shape measuring device, and if greater than or equal to 70% of the entirety (this indicates the case of greater than or equal 70% that is higher than 68% because the measurement points falling within the standard deviation±σ in the normal distribution occupy 68% of the entirety) shows a longer distance than the measurement point in the distribution of distances, the part may be substituted. This is because most of the visible part falls within the range of 70%.

When the opposed parallel surfaces cannot be exposed, in other words, when opposed flat and parallel surfaces cannot be formed (for example, in the case where destruction is not allowed for the preciousness of the material), reflection and scattering are measured by an integrating-sphere reflection and scattering measuring device, and the quantity of absorbed light is measured by increase in temperature by using a laser colorimeter with the same optical incidence kept, and the reflected light and the absorbed light are subtracted from the incident light, and thus the transmittance can be measured. In order to prevent the measurement from being a peculiar value depending on the shape of the single-crystal diamond material, the measurement can be conducted five times with randomly varied incidence directions, and the mean value of the measurements may be employed as a transmittance.

The transmittance of light with a wavelength of greater than or equal to 410 nm and less than or equal to 750 nm can be measured by scanning the wavelength between 410 nm and 750 nm by using a spectrophotometer. When measurement is conducted with laser light, the area corresponding to at least 3 mm of diameter suffices as the opposed flat and parallel surfaces.

The transmittance T of light refers to a percentage of the intensity $I_1$ of the transmitted light to the intensity $I_0$ of the incident light, and is defined by the following formula (1):

$$T (\%) = I_1/I_0 \times 100 \tag{1}$$

The transmittance defined by the above formula (1) strictly takes the reflectivity and the multiple reflection on parallel (the degree of parallelism is less than or equal to) 0.1° principal surfaces into account, and the total transmittance T is represented by the formula (2) below by using the reflectivity $R_1$ and the transmittance $T_1$ on the boundary between the air and the single-crystal diamond material:

$$T = T_1^2 \cdot \exp(-\alpha D)/(1 - R_1^2 \cdot \exp(-\alpha D)) \tag{2}$$

wherein α represents an absorption coefficient (Unit: $cm^{-1}$) and D represents a distance between parallel principal surfaces (Unit: $cm^{-1}$).

In the above formula (2), the reflectivity $R_1$ and the transmittance $T_1$ are represented by the formulae (3) and (4) below, letting the refractive index of the single-crystal diamond material be $n_1$, and the refractive index of the air be no:

$$R_1 = (n_0 - n_1)^2/(n_0 + n_1)^2 \tag{3}$$

$$T_1 = 4 n_0 n_1/(n_0 + n_1)^2 \tag{4}$$

wherein the total transmittance T that is obtained by substituting into the formula (2) the values of reflectivity $R_1$ and the transmittance $T_1$ calculated by letting the refractive index $n_1$ of the single-crystal diamond material be 2.4 and the refractive index no of the air be 1.0 is about 71% in the case of transparency (when approximated to α=0), which agrees with the actual measurement.

On the other hand, since the case of the single-crystal diamond material of the present embodiment is such a case that the absorption coefficient α is large, and the term of the denominator in the right side of the formula (2) is asymptotic to 1, the transmittance is a region that can be represented by the formula (5) below:

$$T = T_1^2 \cdot \exp(-\alpha D) \tag{5}$$

The average resistivity ρav of the single-crystal diamond material is calculated from the voltage $V_0$, the current $I_0$, the area S of the titanium vapor-deposited electrode, and the distance D between parallel principal surfaces (the degree of parallelism is less than or equal to 0.1°) by the formula ρav=($V_0/I_0$)−(S/D). Herein, ρav is measured when $V_0$ is 50 V and D is 0.5 mm. When measurement cannot be conducted with D of 0.5 mm (when the thickness of the plate is insufficient, or when the thickness is too large to polish the plate), the current at the time of application of the voltage corresponding to the electric field of 100 V/mm can be measured. The average resistivity is greater than or equal to $1 \times 10^6$ Ωcm, preferably greater than or equal to $1 \times 10^9$ Ωcm, more preferably greater than or equal to $1 \times 10^{12}$ Ωcm from the view point of ensuring the insulation properties. The single-crystal diamond material having higher average resistivity is preferred because even faint light is less likely to be reflected.

In the single-crystal diamond material of the present embodiment, from the view point of having a jet-black color tone and insulation properties, the transmittance of light with a wavelength of greater than or equal to 410 nm and less than or equal to 750 nm is preferably less than or equal to 3%, more preferably less than or equal to 1.5%, further preferably less than or equal to 1% for any wavelength. When the transmittance of light is less than or equal to 3%, less than or equal to 1.5%, further less than or equal to 1% in the entire region of the visible region (wavelength of greater than or equal to 410 nm and less than or equal to 750 nm), diamond having a jet-black color tone as if black Japanese lacquer were applied (hereinafter, also referred to as jet-black diamond) is obtained. Since the reflectivity of diamond is typically about 30%, a jet-black color tone is obtained and blockage by the absorption of light is sufficient when the transmittance of light is less than or equal to $\frac{1}{10}$, less than or equal to $\frac{1}{20}$, further less than or equal to $\frac{1}{30}$ of the reflectivity.

In the single-crystal diamond material of the present embodiment, from the view point of having the deep black color tone, the insulation properties, and transmissivity of infrared light, the fact that the transmittance of light with a wavelength of 10.6 μm that enters one principal surface substantially perpendicularly and radiates from the other principal surface is greater than or equal to 1% is one index of an insulator. However, when the material is used as a window for far infrared rays, the transmittance of light with the wavelength of 10.6 μm is preferably greater than or equal to 10%, more preferably greater than or equal to 40%, further preferably greater than or equal to 50% so as to obtain the function as the window. On the other hand, when the material is used as a window for near infrared rays, the transmittance of light with a wavelength of 1 to 2 μm is preferably greater than or equal to 10%, more preferably greater than or equal to 40%, further preferably greater than or equal to 50%. Herein, the method for measuring the transmittance of infrared light is similar to the method for measuring the transmittance of light in the visible region as described above. Far infrared light with a wavelength of 10.6 μm is an index of infrared light from the view point that it is often used near at hand in a $CO_2$ laser having an oscillation wavelength of 10.6 μm. As the near infrared light having a wavelength of 1 to 2 μm, a YAG laser having an oscillation wavelength of 1.06 μm, and the second and third harmonics of the quantum cascade laser of 4 to 6 μm can be used.

In the single-crystal diamond material of the present embodiment, from the view point of having the deep black color tone, the insulation properties, and the transmissivity of infrared light, the total nitrogen concentration can be greater than or equal to eight times, preferably greater than or equal to ten times, more preferably greater than or equal to 20 times, still more preferably greater than or equal to 50 times, further preferably greater than or equal to 100 times the isolated substitutional nitrogen concentration. The total nitrogen concentration is measured by secondary ion mass spectrometry (SIMS), and the isolated substitutional nitrogen concentration is measured by an electron spin resonance (ESR) analysis.

In order to obtain the deep black diamond, preferably the jet-black diamond as is the single-crystal diamond material of the present embodiment, it is necessary to incorporate a large quantity of impurities into the diamond. However, when the diamond is doped with too large a quantity of impurities, the crystal lattice of the diamond is broken, and at least part of the diamond is turned into graphite due to formation of SP2 bonds. For this reason, it is necessary to keep a balance so that the crystal lattice of the diamond is relaxed but not be broken while a large quantity of impurities are contained in the diamond. For this purpose, first, it is necessary to incorporate nitrogen.

However, when nitrogen in the isolated substitutional form is incorporated into the diamond, the diamond merely becomes a yellow transparent single crystal likewise the high-pressure-synthesized diamond, and the transmittance of light in the entire visible region of greater than or equal to 410 nm and less than or equal to 750 nm does not decrease. Thus, the content of the isolated substitutional nitrogen atoms is controlled as small as possible, and the content of the non-substitutional nitrogen atoms in a form (for example, interstitial form) other than the isolated substitutional form is increased. Herein, the non-substitutional nitrogen atom refers to a nitrogen atom that is not isolatedly substituted in the diamond lattice position composed of carbon atoms, and corresponds to nitrogen atoms obtained by subtracting the isolated substitutional nitrogen atoms measured by the ESR from the total nitrogen atoms measured by the SIMS. Since the crystal lattice will be cramped and broken when a non-substitutional nitrogen atom is positioned in an interstitial position or the like, the balance is kept with a vacancy left. In this manner, it is possible to incorporate a large quantity of nitrogen that is more than expected into the diamond. This means that the isolated substitutional nitrogen atoms, the non-substitutional nitrogen atoms, the total nitrogen atoms, and the vacancies are allowed to present in the diamond in a balanced manner.

The relation among the isolated substitutional nitrogen concentration $N_S$, the non-substitutional nitrogen concentration $N_N$, the total nitrogen concentration $N_{all}$, and the vacancy concentration V required for keeping a balance among the isolated substitutional nitrogen atoms, the non-substitutional nitrogen atoms, the total nitrogen atoms, and the vacancies is preferably $8 \times N_S \leq N_{all}$, $7 \times N_S \leq N_N$, $N_N \leq N_{all}$, 0.875 ppm$\leq N_N$, and/or 1 ppm$\leq N_{all}$, more preferably $10 \times N_S \leq N_{all}$, $9 \times N_S \leq N_N$, $N_N \leq N_{all}$, 4.50 ppm$\leq N_N$, and/or 5 ppm$\leq N_{all}$, still more preferably $13 \times N_S \leq N_{all}$, $12 \times N_S \leq N_N$, $N_N \leq N_{all}$, 7.38 ppm$\leq N_N$, and/or 8 ppm$\leq N_{all}$, further preferably $20 \times N_S \leq N_{all}$, $19 \times N_S \leq N_N$, $N_N \leq N_{all}$, 9.50 ppm$\leq N_N$, and/or 10 ppm$\leq N_{all}$, further preferably $50 \times N_S \leq N_{all}$, $49 \times N_S \leq N_N$, $N_N \leq N_{all}$, 19.6 ppm$\leq N_N$, and/or 20 ppm$\leq N_{all}$, particularly preferably $100 \times N_S \leq N_{all}$, $99 \times N_S \leq N_N$, $N_N \leq N_{all}$, 29.7 ppm$\leq N_N$, and/or 30 ppm$\leq N_{all}$. Preferably, $N_{all} \leq 1000$ ppm. This is because too high a nitrogen content makes it difficult to keep the lattice of carbon normal.

Herein, regarding the vacancy concentration V, $V \leq 1000 \times N_{all}$ is preferred, and $V \leq 100 \times N_{all}$ is more preferred. This is because if $V > 1000 \times N_{all}$, only the number of vacancies are increased and the crystal becomes brittle. Furthermore, $N_S \leq V$ is preferred and $10 \times N_S \leq V$ is preferred. This is because if $N_S$ V, the entire crystal is tight, and most of the non-substitutional nitrogen atoms and isolated substitutional atoms are cramped, and the crystal is very easily chipped in the single-crystal diamond material. Moreover, $0.1 \times N_N < V$ is preferred, and $N_N < V$ is more preferred. This is because if $N_S \leq V \leq N_N$, part of the non-substitutional nitrogen atoms and the isolated substitutional atoms are cramped, and the crystal is easily chipped in the single-crystal diamond material. Furthermore, $0.1 \times N_{all} < V$ is preferred, and $N_{all} < V$ is more preferred. This is because if $N_N < V \leq N_{all}$, a small part of the non-substitutional nitrogen atoms and the isolated substitutional atoms are cramped, and the crystal is sometimes easily chipped in the single-crystal diamond material. Moreover, $V > 1$ ppm is preferred, and $V > 5$ ppm is more preferred. This is because if $V \leq 1$ ppm, the entire crystal is tight, and at least part of the non-substitutional nitrogen atoms and isolated substitutional atoms are cramped, and the crystal is easily chipped. The vacancy concentration is determined by positron annihilation based on the quantification and measurement by the ion implantation technique. Alternatively, the lower limit vacancy concentration is estimated by subsidiarily using the concentration of vacancies bound with impurities measured by the ESR.

A vacancy sometimes exists alone because it does not largely distort the crystal lattice of diamond. A large quantity of nitrogen in the form other than the isolated single substitutional form can be incorporated into diamond by introducing defects on the growth surface of the single-crystal diamond material under the condition of high methane concentration. While the defects include crystal defects such as dislocation, unevenness of the surface and polishing damage also have an influence, and these are also included in the defects. Nitrogen is introduced into the single-crystal diamond by introduction of a nitrogen gas ($N_2$) into a synthetic environment. The gas is not limited to a nitrogen gas, but may be gases containing nitrogen, such as an ammonia gas ($NH_3$) and a nitrous oxide gas ($N_2O$).

In the single-crystal diamond material of the present embodiment, from the view point of having a deep black color tone, preferably a jet-black color tone, the insulation properties and the transmissivity of infrared light, the non-substitutional nitrogen concentration is preferably greater than or equal to 0.875 ppm, more preferably greater than or equal to 4.50 ppm, still more preferably greater than or equal to 7.38 ppm, further preferably greater than or equal to 9.50 ppm, further preferably greater than or equal to 19.6 ppm, particularly preferably greater than or equal to 29.7 ppm. This is because both the vacancies and non-substitutional nitrogen also exert an effect in the present invention, and are preferably contained in certain quantities or more, and they contribute to the effect of keeping the lattice and decreasing the transmittance of the visible region light while they are balanced. Even if vacancies are formed by irradiation, carbon atoms are necessarily expelled from the lattice position, and only SP2 bonds are increased, and hence a single-crystal diamond material of the present embodiment is not obtained.

In the single-crystal diamond material of the present embodiment, from the view point of having a deep black color tone, preferably a jet-black color tone, the insulation properties and the transmissivity of infrared light, the total nitrogen concentration is preferably greater than or equal to 1 ppm when the total nitrogen concentration is greater than or equal to eight times the isolated substitutional nitrogen concentration, the total nitrogen concentration is more preferably greater than or equal to 5 ppm when the total nitrogen concentration is greater than or equal to ten times the isolated substitutional nitrogen concentration, the total nitrogen concentration is still more preferably greater than or equal to 8 ppm when the total nitrogen concentration is greater than or equal to 13 times the isolated substitutional nitrogen concentration, the total nitrogen concentration is further preferably greater than or equal to 10 ppm when the total nitrogen concentration is greater than or equal to 20 times the isolated substitutional nitrogen concentration, the total nitrogen concentration is further preferably greater than or equal to 20 ppm when the total nitrogen concentration is greater than or equal to 50 times the isolated substitutional nitrogen concentration, and the total nitrogen concentration is particularly preferably greater than or equal to 30 ppm when the total nitrogen concentration is greater than or equal to 100 times the isolated substitutional nitrogen concentration.

In the single-crystal diamond material of the present embodiment, from the view point of being capable of containing a large quantity of nitrogen, and having a deep black color tone, the insulation properties and the transmissivity of infrared light, the total impurity concentration of at least one impurity element selected from the group consisting of magnesium (Mg), aluminum (Al), silicon (Si), phosphorus (P) and sulfur (S) is preferably greater than or equal to 50 ppb, more preferably greater than or equal to 1 ppm, still more preferably greater than or equal to 5 ppm, further preferably greater than or equal to 10 ppm. The total impurity concentration of the impurity element is measured by the SIMS.

As another method for incorporating a large quantity of nitrogen into the single-crystal diamond material, there is a method of incorporating an impurity element other than nitrogen (N), such as silicon (Si), phosphorus (P), aluminum (Al), magnesium (Mg), and/or sulfur (S) together with nitrogen (N). That is, silicon or the like is incorporated in place of a vacancy (to realize a state where silicon or the like is present in a vacancy), and a balance can be kept even when a larger amount of nitrogen is contained in the material. Alternatively, at least two of these impurity elements are selected and incorporated into the material. Letting the concentrations of Si, P, Al, Mg and S be $C_{Si}$, $C_P$, $C_{Al}$, $C_{Mg}$ and $C_S$, respectively, the sum of the total nitrogen concentration $N_{all}$ and the total impurity element concentration of the impurity elements is preferably 1 ppm<($N_{all}$+$C_{Si}$+$C_P$+$C_{Al}$+$C_{Mg}$+$C_S$)<1000 ppm, more preferably 1 ppm<($N_{all}$+$C_{Si}$+$C_P$+$C_{Al}$+$C_{Mg}$+$C_S$)<100 ppm.

In the single-crystal diamond material of the present embodiment, even if nitrogen atoms are not contained, a similar effect is achieved as long as the total impurity element concentration falls within the above range. In other words, in the single-crystal diamond material of the present embodiment, from the view point of having a deep black color tone, the insulation properties and the transmissivity of infrared light, the total impurity element concentration of at least one impurity element selected from the group consisting of magnesium (Mg), aluminum (Al), silicon (Si), phosphorus (P) and sulfur (S) is preferably greater than or equal to 50 ppb, more preferably greater than or equal to 1 ppm, still more preferably greater than or equal to 5 ppm, further preferably greater than or equal to 10 ppm. Letting the concentrations of Si, P, Al, Mg and S be $C_{Si}$, $C_P$, $C_{Al}$, $C_{Mg}$ and $C_S$, respectively, 1 ppm<($N_{all}$+$C_{Si}$+$C_P$+$C_{Al}$+$C_{Mg}$+$C_S$)<1000 ppm is preferred, and 1 ppm<($N_{all}$+$C_{Si}$+$C_P$+$C_{Al}$+$C_{Mg}$+$C_S$)<100 ppm is more preferred.

Also for the impurity element other than nitrogen, namely, at least one impurity element selected from the group consisting of magnesium (Mg), aluminum (Al), silicon (Si), phosphorus (P) and sulfur (S), the total impurity element concentration is preferably greater than or equal to eight times, more preferably greater than or equal to ten times, still more preferably greater than or equal to 20 times, and particularly preferably greater than or equal to 50 times the total substitutional impurity element concentration. The total impurity concentration of the impurity element is measured by the SIMS, and the total substitutional impurity element concentration of the impurity element is measured by the ESR.

When the above impurities are added, it is important that surface defects and crystal defects are contained, and the crystal defects are naturally easily introduced into an element having an atomic radius larger than that of carbon. While these impurities can be supplied in the form of a gas such as $SH_4$, $PH_3$, or $Al(CH_3)_3$, it is convenient to place a solid source such as Si, $P_2O_5$ (or InP), or Al near the substrate. If the solid source is placed at a distance within less than or equal to 10 cm from the substrate, the impurity can be sufficiently introduced into the single-crystal diamond. When the impurities are compositely introduced, a solid source such as heavy P doped Si or AlP can also be used.

Another method for incorporating a large quantity of nitrogen into the single-crystal diamond is a method of incorporating boron (B) as an impurity other than nitrogen (N) together with nitrogen (N). Since boron has an atomic radius similar to that of carbon, it is easily introduced into a lattice position. Additionally, when boron is introduced together with nitrogen, it comes to be contained in the diamond in a large quantity. If boron and nitrogen are introduced in such a condition that the boron concentration $C_B$ and the nitrogen concentration $C_N$ satisfy $C_B > C_N$, conductivity will be imparted. Therefore, it is necessary to employ the condition satisfying $C_B \leq C_N$. In such a condition, if boron is introduced in a substitutional form, the total nitrogen or vacancies compensate the carriers mostly, and the carriers can no longer move, so that the diamond becomes insulative. Moreover, most of boron is introduced in a non-substitutional form, so that the diamond becomes insulative. Boron can be introduced from sources such as $B_2H_6$, $(CH_3)_3B$ and $B(OCH_3)_3$. When boron is introduced compositely with other impurities, a solid source such as BP or heavy B doped Si can also be used.

Also when boron and nitrogen are introduced in the above ratio, the total impurity element concentration measured by the secondary ion mass spectrometry of at least one selected from the group of the impurity elements (i.e., magnesium, aluminum, silicon, phosphorus and sulfur) is preferably greater than or equal to 50 ppb, more preferably greater than or equal to 1 ppm, still more preferably greater than or equal to 5 ppm, particularly preferably greater than or equal to 10 ppm.

In the single-crystal diamond material of the present embodiment, it is desired to mix a large quantity of impurities in a single crystal, and to prepare "deep black diamond" or "jet-black diamond". However, mixing a large quantity of impurities results in deterioration or loss of the long range order in the single crystal, and a thick crystal cannot be formed. Although deterioration or loss or the short range order in the single crystal merely results in occurrence of a local defect, and the single crystal can be repaired as the entirety, extension and increase in crystal defects (vacancies, interstitial impurities and so on) lead to deterioration or loss of the long range order in the single crystal, and make the crystal amorphous or polycrystalline, or cause occurrence of chipping of the crystal. In an amorphous material, impurities are forcibly contained. In a poly crystal, impurities are likely to be contained in grain boundaries. A method for mixing a large quantity of impurities while keeping the crystallinity can be achieved by mixing in a substitutional form. However, the method is incapable of making the transmittance small over the entire visible region, and has a problem of occurrence of electric conduction. With the single-crystal diamond material of the present embodiment, it is possible to achieve black body radiation, and a characteristic for an infrared window by mixing an impurity successfully without occurrence of electric conduction while disturbing local crystals (introducing vacancies).

When the single-crystal diamond material of the present embodiment is used as an infrared optical component material of an infrared window, or a material for monitoring radiation temperature such as a black body for monitoring radiation temperature, the thinness of the material is also advantageous for a plate material. The thickness of the material is preferably less than or equal to 5 mm, more preferably less than or equal to 3 mm, further preferably less than or equal to 2 mm, particularly preferably less than or equal to 1.2 mm. Other thicknesses will do in the case of applications utilizing a color tone for which the thickness is not required to be considered.

(Method for Producing Single-Crystal Diamond Material)

1. Preparation of Seed Substrate

First, as a seed substrate for a single-crystal diamond material, a single-crystal diamond seed substrate is prepared. As the seed substrate, natural single-crystal diamond, high pressure synthesized single-crystal diamond, vapor-phase synthesized single-crystal diamond or the like in the form of a plate is prepared. For example, a 6 mm-square or 8 mm-square seed substrate of high-pressure synthesized single-crystal diamond can be prepared. In the case of vapor-phase synthesized single-crystal diamond, a single-crystal diamond seed substrate of a mosaic pattern in which a plurality of single crystals are tied together can also be prepared. The size may be greater than or equal to 16-mm square. A crystal with a mosaic pattern is also referred to as a single crystal because the individual single crystals are aligned in the range of plane direction within 0.5°, and the crystal is considered as a single crystal in a broad sense.

The seed substrate is mechanically polished to be flat. The density of crystal defects such as dislocation of the seed substrate is preferably greater than or equal to 1000 defects/$mm^2$. When the density of the crystal defects is smaller, a special substrate (rough surface substrate formed by high-load polishing) having an arithmetic mean roughness Ra of surface (this means arithmetic mean roughness Ra defined by JIS B0601:2013, hereinafter the same) of 5 nm to 100 nm is prepared. Herein, the high-load polishing refers to polishing under a high load that is greater than or equal to 1.5 times that in a normal polishing condition, and the high-load polishing causes not only roughening of the surface but also increased damage of the crystal near the surface of the diamond. This makes it easy to introduce a non-substitutional impurity and vacancies than usual. For achieving the high-load polishing, it is necessary to suppress the oscillation of the polishing device because the shaft of the grinder or the like easily oscillate under the influence of the load. Preferably, a seed substrate having an arithmetic mean roughness Ra of surface defined by JIS B0601:2013 of 10 nm to 30 nm is prepared. Alternatively, a substrate (step substrate) having growth steps formed by giving one groove per 100 μm can be prepared. As the step substrate, the one preferably having an off-angle of greater than or equal to 1° and less than or equal to 15°, more preferably greater than or equal to 3° and less than or equal to 10°, further preferably greater than or equal to 5° and less than or equal to 8° is used. This is because if the off-angle is as small as less than 1°, the steps are canceled, and a seed substrate with rough surface cannot be made. Although the normal surface of the seed substrate for allowing epitaxial growth of a normal single-crystal diamond material other than that of the present invention preferably has an arithmetic mean roughness Ra of surface of smaller than 3 nm, it is important in the present invention to use a seed substrate having a surface suited for the present invention by controlling the defects and surface state without using the aforementioned seed substrate having a normal surface.

2. Growth of Single-Crystal Diamond Material

On the seed substrate, a single-crystal diamond material is allowed to epitaxially grow by the CVD (chemical vapor-phase deposition) method. As the CVD method, a hot filament CVD method, a microwave plasma CVD method, a DC plasma CVD method, a DC arc discharge plasma CVD method and the like can be used. Among these, the microwave plasma CVD method and the DC plasma CVD method are preferred because they can easily control impurities.

In the epitaxial growth of the single-crystal diamond material by the microwave plasma CVD method, a single-crystal diamond material can be allowed to epitaxially grow in the following manner: the pressure within the furnace is kept at greater than or equal to 4 kPa and less than or equal to 53.2 kPa by introducing a hydrogen gas, a methane gas, and a nitrogen gas into the synthesis furnace as source gases, and plasma generation is caused by inputting a microwave having a frequency of 2.45 GHz (±50 MHz) or 915 MHz (±50 MHz) at an electric power of 100 W to 60 kW to allow an active seed to deposit on the seed substrate.

The pressure within the furnace is preferably greater than or equal to 4 kPa and less than or equal to 53.2 kPa, more preferably greater than or equal to 8 kPa and less than or equal to 40 kPa, further preferably greater than or equal to 10 kPa and less than or equal to 20 kPa. If the pressure within the furnace is less than 4 kPa, the time required for growth can be increased, or a poly crystal is likely to growth. On the other hand, if the pressure within the furnace exceeds 53.2 kPa, the discharge can be unstable, or concentrated in one site during growth, and long time growth becomes difficult.

The temperature of the seed substrate is preferably greater than or equal to 800° C. and less than or equal to 1300° C., more preferably greater than or equal to 900° C. and less than or equal to 1100° C. If the temperature of the substrate is less than 800° C., the time required for growth is extended. On the hand, if the temperature of the substrate exceeds 1300° C., graphite is likely to grow.

In the vapor phase where the single-crystal diamond material is allowed to grow, the ratio of the methane gas concentration to the hydrogen gas concentration is preferably greater than or equal to 7% and less than or equal to 30%, and the ratio of the nitrogen gas concentration to the methane gas concentration is preferably greater than or equal to 0.1% and less than or equal to 10%. As a result of this, it is possible to obtain a single-crystal diamond material in which the ratio of the number of isolated substitutional nitrogen atoms in the single-crystal diamond to the total nitrogen atom number in the single-crystal diamond is greater than or equal to 0.1% and less than or equal to 20%, in combination with the effect of using a special seed substrate having an arithmetic mean roughness Ra of surface of 5 nm to 100 nm (rough surface seed substrate formed by high-load polishing). Further, it is possible to obtain single-crystal diamond in which the total nitrogen atom concentration in the single-crystal diamond material is greater than or equal to 0.5 ppm and less than or equal to 100 ppm, and the concentration of the isolated substitutional nitrogen atoms is greater than or equal to 30 ppb and less than or equal to 5 ppm. The ratio of the methane gas concentration to the hydrogen gas concentration is more preferably greater than or equal to 10% and less than or equal to 25%, further preferably greater than or equal to 16% and less than or equal to 25%. The ratio of the nitrogen gas concentration to the methane gas concentration is more preferably greater than or equal to 0.5% and less than or equal to 10%, further preferably greater than or equal to 1% and less than or equal to 10%. It is preferred that the nitrogen gas concentration Cn (%) and the methane gas concentration Cc (%) satisfy the relation of the following formula (6):

$$A + B \times \log 10 Cn = Cc \quad (6)$$

wherein $10 \leq A \leq 20$ and $2 \leq B \leq 7$.

A single-crystal diamond material is allowed to grow on a special seed substrate having an arithmetic mean roughness Ra of surface of 5 nm to 100 nm (rough surface seed substrate formed by high-load polishing) while the nitrogen gas concentration Cn (%) and the methane gas concentration Cc (%) satisfy the relation of the above formula. The single-crystal diamond material obtained in this manner has the transmittance of light in the visible region of less than or equal to 15%, and has improved chipping resistance while keeping the hardness of the single-crystal diamond material.

Further, when another impurity is added, a solid small piece is placed near the single-crystal substrate, and exposed to plasma of a microware, and thus the impurity is mixed into a synthesis gas environment and doping is conducted. When the impurity is silicon, quartz or silicon which is a semiconductor can be recited as the solid, and when the impurity is aluminum, single-crystal sapphire or polycrystalline alumina can be recited as the solid.

In the epitaxial growth of the single-crystal diamond material, from the view point of growing a thick single-crystal diamond material, it is preferred to repeat the cycle of continuing the growth under the condition α where a large quantity of impurities (e.g., nitrogen) are introduced for a certain time until a certain thickness $D_A$ is achieved, then continuing the growth under the condition β where every impurity (including nitrogen) is excluded for another certain time until a certain thickness $D_B$ is achieved, and then allowing growth under the original condition α. As a result, a single-crystal diamond material that keeps a large absorption coefficient due to a large quantity of impurities and has a large thickness is obtained.

In the epitaxial growth of the material of the single-crystal diamond, preferred relations between $D_A$ and $D_B$ are:

$D_A \leq 0.5$ mm and $0.008$ mm$\leq D_B$ when $10$ ppm$\leq N_{all}$, $D_A \leq 0.8$ mm and $0.005$ mm$\leq D_B$ when $5$ ppm$\leq N_{all} < 10$ ppm, and $D_A \leq 1.2$ mm and $0.003$ mm$\leq D_B$ when $1$ ppm$< 5$ ppm.

$N_{all}$ represents a total nitrogen quantity. $D_B$ is preferably as small as possible, but if it is less than the above conditions, it is impossible to return to the original condition and a satisfactory result cannot be obtained. If $D_A$ is larger than the above conditions, the graphite component suddenly increases.

Thickness $D_{total}$ of the diamond material that is finally formed by the repetitive growth is represented by the formula (7):

$$D_{total} = n \times (D_A + D_B) \quad (7).$$

Herein, n is the number of cycles of repetition. By increasing the number of repetition, the thickness can be increased, and the transmittance can be decreased. If $N_{all}$ is less than 1 ppm, an unrealizable thickness is required to achieve the black color of the present invention.

3. Separation of Single-Crystal Diamond Material from Seed Substrate

Then, the epitaxially grown single-crystal diamond is separated from the seed substrate to obtain a single-crystal diamond material. As the technique for separation, for example, a method of cutting by laser irradiation, and a method of preliminarily forming a separation boundary by ion implantation, growing a single-crystal diamond material on the ion implantation surface, and then separating the diamond material at the separation boundary of ion implantation can be recited.

The tool according to another embodiment of the present invention includes the single-crystal diamond material of the foregoing embodiment. Therefore, the tool of the present embodiment can be a tool that is little chipped during preparation and use of the tool. Non-limiting examples of the tool of the present embodiment include a cutting bite, a milling wiper, an end mill, a drill, a reamer, a cutter, a dresser, a wire guide, a wiredrawing dice, a waterjet nozzle, a diamond knife, a glass cutter, and a scriber.

The radiation temperature monitor according to still another embodiment of the present invention includes the single-crystal diamond material of the foregoing embodiment. Therefore, the radiation temperature monitor of the present embodiment is closer to black body radiation, and is capable of evaluating the true temperature. Non-limiting examples of the radiation temperature monitor of the present embodiment include a temperature monitoring chip, and a holder for monitoring temperature.

The infrared optical component according to yet still another embodiment of the present invention includes the single-crystal diamond material of the foregoing embodiment. Therefore, the infrared optical component of the present embodiment is accompanied by as little leakage of visible light as possible, and is capable of sensing the infrared light sufficiently. Non-limiting specific examples of the infrared optical component of the present embodiment include an infrared window, an infrared lens, and a screen for an infrared window for blocking debris and waste.

EXAMPLES

Example I

1. Preparation of Seed Substrate

As seed substrates, substrates formed of Ib-type single-crystal diamond (500 μm thick, 5 mm-square) manufactured by a high-temperature high-pressure synthesis method were prepared. The plane direction of the principal surfaces of these substrates was (001) plane. The principal surfaces of these prepared seed substrates were mechanically polished so that they were deviated off by 3° in the [001] direction from the (001) plane. Then, in the surfaces of these seed substrates, polishing flaws were formed with a metal bond diamond whetstone while the speed was controlled so that the arithmetic mean roughness Ra was 10 nm, and thus the surfaces were roughened.

2. Growth of Single-Crystal Diamond Material

The three seed substrates were placed in a known microwave plasma CVD device, and on the three seed substrates, three single-crystal diamond materials having different concentrations of contained nitrogen were allowed to epitaxially grow. Herein, the frequency of the microwave was 2.45 GHz, the power of the microwave was 5 kW, and the growth time was 60 hours. In this manner, three types of vapor-phase synthesized single-crystal diamond materials having a thickness of 1.2 mm were formed.

3. Separation of Single-Crystal Diamond Material from Seed Substrate

By cutting the obtained three types of vapor-phase synthesized single-crystal diamond materials with a laser, these were separated from the seed substrates, and then the surfaces of the three types of vapor-phase synthesized single-crystal diamond materials were polished to be flat.

4. Measurement of Physical Properties of Single-Crystal Diamond Material

For the obtained three types of single-crystal diamond materials (Samples 1 to 3) and the prepared high-temperature high-pressure synthesized Ib-type diamond material (comparative sample), the total nitrogen concentration, the isolated substitutional nitrogen concentration, and the light transmittance were measured. The total nitrogen concentration was measured by the SIMS. The isolated substitutional nitrogen concentration was measured by the ESR analysis. The light transmittance was measured by using a commercially available spectrophotometer.

Samples I-1 to I-3 are single-crystal diamond materials prepared by using seed substrates having an arithmetic mean roughness Ra of surface of 10 nm, and had a total nitrogen concentration of 10 ppm, 20 ppm, and 30 ppm, respectively, and an isolated substitutional nitrogen concentration of 100 ppb, 180 ppb, and 250 ppb, respectively. On the other hand, the comparative sample had a total nitrogen concentration of 150 ppm, and an isolated substitutional nitrogen concentration of 150 ppm.

In Samples I-1 to I-3, the transmittance of light at the wavelength at which the maximum transmittance is shown in the visible region of 410 nm to 750 nm was 14%, 9%, and 1.5%, respectively, which correspond to "deep black diamond," "deep black diamond," and "jet-black diamond," respectively. All of Samples I-1 to I-3 were used for a radiation temperature monitor, and recorded a correct temperature in agreement with the actual condition. Cutting tools were manufactured using the obtained single-crystal diamond materials and tested. The test was conducted by using an aluminum material A5052 as a material to be cut under the conditions of a cutting speed of 500 m/min, a cutting amount of 0.01 mm, and a feeding amount of 0.01 mm/rev. As a result, it was confirmed that the cutting tools were little chipped and had excellent abrasion resistance. All of Samples I-1 to I-3 almost blocked the visible light as a window material and were black, and transmitted greater than or equal to 40% of the infrared light with a wavelength of 10.6 μm, and they transmitted 62%, 55%, 48% of the infrared light, respectively. On the other hand, the comparative sample was a yellow transparent plate, and well transmitted the light with a wavelength of 750 nm. On both sides of a plate of each sample that had a thickness of 0.5 mm, and was polished on both sides to have an arithmetic mean roughness Ra of surface of less than or equal to 1 nm and a degree of parallelism of less than or equal to 0.1°, a Ti electrode having a diameter of 1.6 mm was vapor-deposited to have a thickness of 200 nm, and the current-voltage characteristics were measured by applying a voltage of 50 V at room temperature (25° C.). Every sample little passed the current, revealing that every sample showed a resistivity of greater than or equal to $1 \times 10^{12}$ Ωcm.

Example II

In the present example, a single-crystal diamond material was prepared in the same manner as in Example I except that the surface roughness Ra of the seed substrate, and the methane concentration and the nitrogen concentration during growth of crystals were changed, and physical properties of the single-crystal diamond material were measured.

When the total nitrogen concentration in the single-crystal diamond material was less than or equal to 10 ppm, the material was synthesized with a methane concentration of 10%; when the total nitrogen concentration in the single-crystal diamond material was higher than 10 ppm and less than or equal to 90 ppm, the material was synthesized with a methane concentration of 18%; and when the total nitrogen concentration in the single-crystal diamond material was higher than 90 ppm, the material was synthesized with a methane concentration of 25%. The nitrogen concentration in the single-crystal diamond material was adjusted by varying the nitrogen concentration within the range of 0.1 to 10%. Preparation of the single-crystal diamond material was conducted by occasionally allowing crystals to grow under the condition without addition of nitrogen, and again allowing crystals to grow with addition of the same concentration of nitrogen. Indices for starting the condition without addition of nitrogen are as follows: 3 μm growth was conducted at the thickness of the single-crystal diamond of 1.0 to 1.2 mm when the aimed total nitrogen concentration was less than 5 ppm; 5 μm growth was conducted at the thickness of the single-crystal diamond of 0.7 to 0.8 mm when the aimed total nitrogen concentration was greater than or equal to 5 ppm and less than 10 ppm; 8 μm growth was conducted at the thickness of the single-crystal diamond of 0.4 to 0.5 mm when the aimed total nitrogen concentration was greater than or equal to 10 ppm and less than 90 ppm; and 8 μm growth was conducted at the thickness of the single-crystal diamond of 0.3 to 0.4 mm when the aimed total nitrogen concentration was greater than or equal to 90 ppm. This was for mixing a non-substitutional impurity at high concentration into the single-crystal diamond material without destroying the crystal lattice. The results of the prepared Samples II-1 to II-9 are shown collectively in Table 1. In Table 1, "visible light transmittance" shows the transmittance of light at the wavelength at which the maximum transmittance is shown in the visible region of 410 nm to 750 nm.

A cutting tool was prepared, and tested. A cutting tip was prepared by cutting a material into a thickness of 1 to 2 mm, brazing the cut piece to a shank for a tool, and then working the edge. The test was conducted by using an aluminum material A5052 as a material to be cut under the conditions of a cutting speed of 500 m/min, a cutting amount of 0.01 mm, and a feeding amount of 0.01 mm/rev. As a result, it was confirmed that the cutting tool was little chipped and had excellent abrasion resistance. Regarding Samples II-1 to II-8, the large proportion of the total nitrogen concentration to the isolated substitutional nitrogen seemed to contribute to high chipping resistance and high abrasion resistance of these samples. Focusing on Sample II-1, the effect is observed when the non-substitutional nitrogen concentration is greater than or equal to 0.88 ppm, or when the sum of the vacancy concentration and the non-substitutional nitrogen concentration is greater than or equal to 5 ppm. In Sample II-9, the ratio of the total nitrogen concentration to the isolated substitutional nitrogen concentration was 2.8, which was lower than 8, and the transmittance in the visible region was as large as 67%.

TABLE 1

| Example II | Seed substrate Ra (nm) | Total nitrogen concentration (ppm) | Isolated substitutional nitrogen concentration (ppm) | Non-substitutional nitrogen concentration (ppm) | Vacancy concentration (ppm) | Thickness (mm) |
|---|---|---|---|---|---|---|
| Sample II-1 | 5 | 1 | 0.12 | 0.88 | 5 | 4.8 |
| Sample II-2 | 10 | 5 | 0.46 | 4.54 | 7 | 4.2 |
| Sample II-3 | 10 | 8 | 0.6 | 7.4 | 16 | 3 |
| Sample II-4 | 20 | 10 | 0.5 | 9.5 | 15 | 2 |
| Sample II-5 | 20 | 23 | 0.43 | 22.57 | 40 | 1.5 |
| Sample II-6 | 30 | 35 | 0.9 | 34.1 | 80 | 1.2 |
| Sample II-7 | 40 | 56 | 0.5 | 55.5 | 70 | 1.2 |
| Sample II-8 | 50 | 110 | 0.7 | 109.3 | 200 | 1 |
| Sample II-9 | <1 | 0.7 | 0.25 | 0.45 | 1 | 1 |

| Example II | Isolated substitutional nitrogen/ total nitrogen (%) | Ratio of total nitrogen/isolated substitutional nitrogen | Non-substitutional nitrogen concentration (ppm) | Transmittance of visible light (%) | Transmittance of infrared light (%) | Resistivity (Ωcm) |
|---|---|---|---|---|---|---|
| Sample II-1 | 12 | 8.3 | 0.88 | 14.8 | 43 | $>1 \times 10^{10}$ |
| Sample II-2 | 9.2 | 10.9 | 4.54 | 12.8 | 46 | $>1 \times 10^{10}$ |
| Sample II-3 | 7.5 | 13.3 | 7.40 | 9.5 | 52 | $>1 \times 10^{10}$ |
| Sample II-4 | 5.0 | 20.0 | 9.50 | 7.6 | 47 | $>2 \times 10^{12}$ |
| Sample II-5 | 1.9 | 53.5 | 22.57 | 2.9 | 48 | $>2 \times 10^{12}$ |
| Sample II-6 | 2.6 | 38.9 | 34.10 | 2.4 | 51 | $>2 \times 10^{12}$ |
| Sample II-7 | 0.9 | 112.0 | 55.50 | 0.7 | 51 | $>2 \times 10^{12}$ |
| Sample II-8 | 0.6 | 157.1 | 109.30 | 0.6 | 47 | $>1 \times 10^{11}$ |
| Sample II-9 | 35.7 | 2.8 | 0.45 | 67 | 68 | $>2 \times 10^{12}$ |

Referring to Table 1, in Samples II-1 to II-8, by the surface state of the seed substrate and the crystal growth synthesis condition of the single-crystal diamond material, the total nitrogen concentration was made higher in comparison with the isolated substitutional nitrogen concentration (in other words, the total nitrogen concentration to the isolated substitutional nitrogen concentration was made higher), vacancies were introduced, the transmittance of light in the desired visible region was less than or equal to 15%, the transmittance of light in the infrared region with a wavelength of 10.6 μm was greater than or equal to 40%, and the resistivity was greater than or equal to $1 \times 10^6$ Ωcm. Samples II-1 to II-8 could be used as an infrared window, or as a radiation temperature monitor for black body radiation.

Example III

In the present example, a single-crystal diamond material was prepared in the same manner as in Example I except that the surface roughness Ra of the seed substrate, the methane concentration and the nitrogen concentration during growth of crystals, and the total impurity element concentration and the total substitutional impurity element concentration of at least one impurity element of Mg, Al, Si, P, and S were changed, and physical properties of the material were measured. Addition of at least one impurity element of Mg, Al, Si, P, and S was conducted by placing small pieces (each 1 mm×2 mm) of MgO, $Al_2O_3$, Si, InP, or ZnS near the seed substrate, and the addition amount was controlled by the number of small pieces. When the total nitrogen concentration in the single-crystal diamond material was less than or equal to 10 ppm, the synthesis was conducted with a methane concentration of 10%, and when the total nitrogen concentration in the single-crystal diamond material was greater than 10 ppm and less than or equal to 90 ppm, the synthesis was conducted with a methane concentration of 18%. The nitrogen concentration in the single-crystal diamond material was adjusted by varying the nitrogen concentration in the single-crystal diamond material within the range of 0.1 to 10%. Preparation of the single-crystal diamond material was conducted by occasionally allowing crystals to grow under the condition without addition of nitrogen, and again allowing crystals to grow with addition of the same concentration of nitrogen in the same manner as in Example II. Since solid sources were used for other impurity elements than nitrogen, the condition was not completely without addition, but a $CO_2$ gas was added in an amount of 10% of the methane gas only at that time to suppress presence of the impurity elements. Indices for starting the condition without addition of nitrogen were the same as in Example II. This was for mixing a non-substitutional impurity at high concentration into the single-crystal diamond material without destroying the crystal lattice. The results of the prepared Samples III-1 to III-10 are shown collectively in Table 2. In Table 2, "visible light transmittance" shows the transmittance of light at the wavelength at which the maximum transmittance is shown in the visible region of 410 nm to 750 nm.

TABLE 2

| Example III | Seed substrate Ra (nm) | Total nitrogen concentration (ppm) | Isolated substitutional nitrogen concentration (ppm) | Vacancy concentration (ppm) | Thickness (mm) | Isolated substitutional nitrogen/ total nitrogen (%) | Ratio of total nitrogen/ isolated substitutional nitrogen | Non-substitutional nitrogen concentration (ppm) | Mg concentration (ppm) |
|---|---|---|---|---|---|---|---|---|---|
| Sample III-1 | 15 | 0.05 | 0.02 | 30 | 2.2 | 40.0 | 2.5 | 0.03 | 8 |
| Sample III-2 | 15 | 0.04 | 0.01 | 40 | 1.8 | 25.0 | 4.0 | 0.03 | <0.01 |
| Sample III-3 | 15 | 0.06 | 0.03 | 60 | 1.5 | 50.0 | 2.0 | 0.03 | <0.01 |
| Sample III-4 | 15 | 0.6 | 0.2 | 50 | 1.2 | 33.3 | 3.0 | 0.40 | <0.01 |
| Sample III-5 | 15 | 0.5 | 0.1 | 70 | 1.2 | 20.0 | 5.0 | 0.40 | <0.01 |
| Sample III-6 | 10 | 1 | 0.07 | 30 | 2.8 | 7.0 | 14.3 | 0.93 | 0.1 |
| Sample III-7 | 20 | 10 | 0.2 | 20 | 1.7 | 2.0 | 50.0 | 9.80 | 0.05 |
| Sample III-8 | 40 | 56 | 0.3 | 80 | 1 | 0.5 | 186.7 | 55.70 | <0.01 |
| Sample III-9 | <1 | 0.7 | 0.25 | 1 | 1 | 35.7 | 2.8 | 0.45 | <0.01 |
| Sample III-10 | <1 | 0.7 | 0.25 | 1 | 1 | 35.7 | 2.8 | 0.45 | <0.01 |

| Example III | Al concentration (ppm) | Si concentration (ppm) | P concentration (ppm) | S concentration (ppm) | Total concentration of Mg, Al, Si, P, and S (ppm) | Total substitutional concentration of Mg, Al, Si, P, and S (ppm) | Ratio of total concentration/ total substitutional concentration | Transmittance of visible light (%) | Transmittance of infrared light (%) | Resistivity ($\Omega$cm) |
|---|---|---|---|---|---|---|---|---|---|---|
| Sample III-1 | <0.01 | 5 | <0.01 | <0.01 | 13 | 0.5 | 26.0 | 9.5 | 57 | $>1 \times 10^9$ |
| Sample III-2 | 13 | <0.01 | 2 | 1 | 16 | 0.3 | 53.3 | 7.9 | 48 | $>1 \times 10^9$ |
| Sample III-3 | <0.01 | 22 | 2 | 2 | 26 | 0.8 | 32.5 | 1.8 | 52 | $>1 \times 10^9$ |
| Sample III-4 | 18 | <0.01 | <0.01 | <0.01 | 18 | 0.3 | 60.0 | 7.0 | 56 | $>1 \times 10^9$ |
| Sample III-5 | <0.01 | 25 | <0.01 | <0.01 | 25 | 0.7 | 35.7 | 2.7 | 52 | $>1 \times 10^9$ |
| Sample III-6 | 0.2 | 5.0 | <0.01 | <0.01 | 5.3 | 0.1 | 53.0 | 12.5 | 54 | $>1 \times 10^{10}$ |
| Sample III-7 | 0.05 | 0.10 | 0.01 | 0.01 | 0.22 | <0.01 | >22.0 | 5.4 | 50 | $>2 \times 10^{12}$ |
| Sample III-8 | <0.01 | 0.05 | <0.01 | <0.01 | 0.05 | <0.01 | >5.0 | 0.9 | 52 | $>2 \times 10^{12}$ |
| Sample III-9 | <0.01 | 1 | <0.01 | <0.01 | 1 | 0.3 | 3.3 | 67 | 69 | $>2 \times 10^{12}$ |
| Sample III-10 | <0.01 | <0.01 | <0.01 | <0.01 | <0.01 | <0.01 | — | 67 | 69 | $>2 \times 10^{12}$ |

Referring to Table 2, in Samples III-1 to III-8, by the surface state of the seed substrate and the crystal growth synthesis condition of the single-crystal diamond material, the ratio of the total nitrogen concentration to the isolated substitutional nitrogen concentration was as large as greater than or equal to 2.5, in impurity elements other than nitrogen, the ratio of the total impurity element concentration to the total substitutional impurity element concentration was large (the ratio was greater than or equal to 8 in Samples III-1 to III-7), vacancies were introduced, the transmittance of light in the desired visible region was less than or equal to 15%, the transmittance of light in the infrared region with a wavelength of 10.6 μm was greater than or equal to 40%, and the resistivity was greater than or equal to $1 \times 10^6$ Ωcm. As in Samples III-1 to III-5, even when the total nitrogen concentration was low, a large quantity of other impurity elements were introduced in a non-substitutional form, and the transmittance of light in the desired visible region was less than or equal to 15%. Samples III-1 to III-8 could be used as an infrared window, or as a radiation temperature monitor for black body radiation. A cutting tool was prepared, and tested. The test was conducted by using an aluminum material A5052 as a material to be cut under the conditions of a cutting speed of 500 m/min, a cutting amount of 0.01 mm, and a feeding amount of 0.01 mm/rev. As a result, it was confirmed that the cutting tool was little chipped and had excellent abrasion resistance. Regarding Samples III-1 to III-8, the large proportion of the total impurity element concentration to the total substitutional impurity element concentration seemed to contribute to high chipping resistance and high abrasion resistance of these samples. In Samples III-9 and III-10, also in nitrogen, and also in the above impurity elements, the ratio of the (total) element concentration to the isolated (total) substitutional element concentration was not greater than or equal to 8, and the transmittance in the visible region was as large as 67%.

Example IV

In the present example, a single-crystal diamond material was prepared in the same manner as in Example I except that the surface roughness Ra of the seed substrate, the methane concentration and the nitrogen concentration during growth of crystals, and the concentration of at least one impurity element of B, Al, and Si were changed, and physical properties of the material were measured. Addition of boron was conducted by introduction of a $B_2H_6$ gas, and addition of Al and Si was conducted in the same manner as in Example III. When the total nitrogen concentration in the single-crystal diamond material was less than or equal to 10 ppm, the synthesis was conducted with a methane concentration of 10%, and when the total nitrogen concentration in the single-crystal diamond material was greater than 10 ppm and less than or equal to 90 ppm, the synthesis was conducted with a methane concentration of 18%. The nitrogen concentration in the single-crystal diamond material was adjusted by varying the nitrogen concentration within the range of 0.1 to 10%. Preparation of the single-crystal diamond material was conducted by occasionally allowing crystals to grow under the condition without addition of nitrogen and addition of boron, and again allowing crystals to grow with addition of the same concentration of nitrogen and boron. Since solid sources were used for other impurity elements than nitrogen and boron, the condition was not completely without addition, but a $CO_2$ gas was added in an amount of 10% of the methane gas only at that time to suppress presence of the impurity elements. Indices for starting the condition without addition of nitrogen were the same as in Example II. This was for mixing a non-substitutional impurity at high concentration into the single-crystal diamond material without destroying the crystal lattice. The results of the prepared Samples IV-1 to IV-10 are shown collectively in Table 3. In Table 3, "visible light transmittance" shows the transmittance of light at the wavelength at which the maximum transmittance is shown in the visible region of 410 nm to 750 nm.

| Example IV | Seed substrate Ra (nm) | Total nitrogen concentration (ppm) | Isolated Substitutional nitrogen concentration (ppm) | Vacancy concentration (ppm) | Thickness (mm) | Substitutional nitrogen/ total nitrogen (%) | Ratio of total nitrogen/ substitutional nitrogen | Non-substitutional nitrogen concentration (ppm) |
|---|---|---|---|---|---|---|---|---|
| Sample IV-1 | 20 | 10 | 0.4 | 30 | 1.9 | 4 | 25.0 | 9.6 |
| Sample IV-2 | 20 | 10 | 0.5 | 40 | 2 | 5 | 20.0 | 9.5 |
| Sample IV-3 | 30 | 100 | 0.6 | 320 | 1.2 | 0.6 | 166.7 | 99.4 |
| Sample IV-4 | 30 | 110 | 0.7 | 350 | 1.2 | 0.64 | 157.1 | 109.3 |
| Sample IV-5 | 40 | 540 | 1.5 | 1300 | 1 | 0.28 | 360.0 | 538.5 |
| Sample IV-6 | 40 | 520 | 2 | 1600 | 1 | 0.38 | 260.0 | 518 |
| Sample IV-7 | 50 | 780 | 2.2 | 2100 | 0.8 | 0.28 | 354.5 | 777.8 |
| Sample IV-8 | 50 | 800 | 2.7 | 2500 | 0.8 | 0.34 | 296.3 | 797.3 |
| Sample IV-9 | <1 | 10 | 2 | 20 | 1.5 | 20 | 5.0 | 8 |
| Sample IV-10 | <1 | 100 | 5 | 120 | 1.5 | 5 | 20.0 | 95 |

-continued

| Example IV | B concentration (ppm) | Al concentration (ppm) | Si concentration (ppm) | B, Al, Si total concentration (ppm) | Transmittance of visible light (%) | Transmittance of infrared light (%) | Resistivity ($\Omega$cm) |
|---|---|---|---|---|---|---|---|
| Sample IV-1 | 8 | <0.01 | <0.01 | 8 | 12.5 | 49 | $9 \times 10^7$ |
| Sample IV-2 | 8 | 1 | 8 | 17 | 9.3 | 48 | $3 \times 10^8$ |
| Sample IV-3 | 90 | <0.01 | <0.01 | 90 | 4.4 | 50 | $2 \times 10^7$ |
| Sample IV-4 | 80 | 5 | 20 | 105 | 2.7 | 47 | $7 \times 10^7$ |
| Sample IV-5 | 430 | <0.01 | <0.01 | 430 | 2.8 | 48 | $8 \times 10^6$ |
| Sample IV-6 | 400 | 10 | 50 | 460 | 2.1 | 45 | $1 \times 10^7$ |
| Sample IV-7 | 720 | <0.01 | <0.01 | 720 | 1.8 | 48 | $2 \times 10^6$ |
| Sample IV-8 | 680 | 10 | 60 | 750 | 1.2 | 44 | $5 \times 10^6$ |
| Sample IV-9 | 25 | <0.01 | <0.01 | 25 | <1 | <1 | $3 \times 10^1$ |
| Sample IV-10 | 180 | <0.01 | <0.01 | 180 | <1 | <1 | $5 \times 10^{-2}$ |

Referring to Table 3, in Samples IV-1 to IV-8, by the surface state of the seed substrate and the crystal growth synthesis condition of the single-crystal diamond material, the total nitrogen concentration was increased in comparison with the isolated substitutional nitrogen concentration, vacancies were introduced, the transmittance of light in the desired visible region was less than or equal to 15%, the transmittance of light in the infrared region with a wavelength of 10.6 μm was greater than or equal to 40%, and the resistivity was greater than or equal to $1 \times 10^6$ $\Omega$cm. Samples IV-1 to IV-8 could be used as an infrared window, or as a radiation temperature monitor for black body radiation. A cutting tool was prepared, and tested. The test was conducted by using an aluminum material A5052 as a material to be cut under the conditions of a cutting speed of 500 m/min, a cutting amount of 0.01 mm, and a feeding amount of 0.01 mm/rev. As a result, it was confirmed that the cutting tool was little chipped and had excellent abrasion resistance. In Samples IV-9 and IV-10, since the boron concentration was higher than the nitrogen concentration, and the resistivity was low, the transmittance was low both in the visible region and in the infrared region.

It is to be understood that the embodiments and examples disclosed herein are illustrative but not limitative in all respects. The scope of the present invention is specified by claims rather than by the above description, and is intended to involve any modification within the meaning and scope equivalent to claims.

The invention claimed is:

1. A single-crystal diamond material exhibiting a transmittance less than or equal to 15% of light having a wavelength of greater than or equal to 410 nm and less than or equal to 750 nm, the single-crystal diamond material being at least either of an electrical insulator according to optical evaluation and an electrical insulator according to electrical evaluation, wherein a criterion of said optical evaluation is a transmittance of light with a wavelength of 10.6 μm of greater than or equal to 1%, wherein a criterion of said electrical evaluation is an average resistivity of greater than or equal to $1 \times 10^6$ $\Omega$cm, and wherein the single-crystal diamond material having a total impurity element concentration of at least one impurity element selected from the group consisting of magnesium, aluminum, silicon, phosphorus and sulfur of greater than or equal to eight times a total substitutional impurity element concentration of said impurity element.

2. The single-crystal diamond material according to claim 1, wherein the transmittance of light with a wavelength of greater than or equal to 410 nm and less than or equal to 750 nm is less than or equal to 3% for any wavelength.

3. The single-crystal diamond material according to claim 1, having a total nitrogen concentration greater than or equal to eight times an isolated substitutional nitrogen concentration.

4. The single-crystal diamond material according to claim 1, having a non-substitutional nitrogen concentration of greater than or equal to 0.875 ppm, the non-substitutional nitrogen concentration being obtained by subtracting an isolated substitutional nitrogen concentration from a total nitrogen concentration.

5. The single-crystal diamond material according to claim 1, having a vacancy concentration higher than at least any of an isolated substitutional nitrogen concentration, a non-substitutional nitrogen concentration, a total nitrogen concentration and 1 ppm.

6. The single-crystal diamond material according to claim 1, having a total impurity element concentration of at least one impurity element selected from the group consisting of magnesium, aluminum, silicon, phosphorus and sulfur, and the total impurity element concentration is greater than or equal to 50 ppb.

7. The single-crystal diamond material according to claim 1, having a total boron concentration of less than or equal to a total nitrogen concentration.

8. A tool comprising the single-crystal diamond material according to claim 7.

9. A radiation temperature monitor comprising the single-crystal diamond material according to claim 1.

10. An infrared optical component comprising the single-crystal diamond material according to claim 1.

* * * * *